United States Patent
Wang et al.

(10) Patent No.: US 7,078,779 B2
(45) Date of Patent: Jul. 18, 2006

(54) ENHANCED COLOR IMAGE SENSOR DEVICE AND METHOD OF MAKING THE SAME

(75) Inventors: Wen-De Wang, Chiayi (TW); Dun-Nian Yaung, Taipei (TW); Tzu-Hsuan Hsu, Kaohsiung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/966,641

(22) Filed: Oct. 15, 2004

(65) Prior Publication Data

US 2006/0081898 A1    Apr. 20, 2006

(51) Int. Cl.
*H01L 31/0232* (2006.01)
(52) U.S. Cl. ............... 257/432; 257/290; 257/291; 257/294
(58) Field of Classification Search ........ 257/290–294, 257/432

See application file for complete search history.

(56) References Cited

U.S. PATENT DOCUMENTS

| 5,631,753 A | * | 5/1997 | Hamaguchi et al. ........ 349/110 |
| 5,633,739 A | * | 5/1997 | Matsuyama et al. ........ 349/106 |
| 5,747,790 A | * | 5/1998 | Shimomura et al. ..... 250/208.1 |
| 6,162,654 A | * | 12/2000 | Kawabe ...................... 438/30 |
| 6,525,758 B1 | * | 2/2003 | Gaudiana et al. ........... 347/238 |

FOREIGN PATENT DOCUMENTS

| JP | 64040889 A | * | 2/1998 |
| KR | 2001011607 A | * | 2/2001 |

* cited by examiner

*Primary Examiner*—Allan R. Wilson
(74) *Attorney, Agent, or Firm*—Tung & Associates

(57) ABSTRACT

A semiconductor device including a substrate having a plurality of image sensing elements formed therein, a plurality of spaced apart color filters overlying the substrate and a light blocking material interposed between adjacent spaced apart color filters.

54 Claims, 7 Drawing Sheets

ENHANCED COLOR IMAGE SENSOR DEVICE AND METHOD OF MAKING THE SAME

FIELD OF THE INVENTION

The present invention relates to semiconductor devices and methods of making the same, and more particularly to a color image sensor device and methods of making the same.

BACKGROUND OF THE INVENTION

Semiconductor color image sensor devices have been used in video cameras, charge-coupled devices, and CMOS image sensors. Such image sensors are based on a two-dimensional array of pixels with each pixel including a color filter located over a sensing element. An array of microlenses located over the color filter focuses light from an optical image through the color filter into the image sensor elements. Each image sensing element (sensor) is capable of converting a portion of the optical image passing through the color filter into an electronic signal. The electronic signal from all the image sensing elements are then used to generate an optical image on a video monitor or other similar device.

FIG. 1 illustrates a prior art semiconductor color image sensor device 10. The device ten includes a semiconductor substrate 12, for example a silicon based substrate. A plurality of image sensing elements (sensors) are provided, for example a first sensor 4, a second sensor 6, and a third sensor 8. A first interlayer dielectric 16 is provided over the substrate 12. The first interlayer dielectric 16 may be any suitable dielectric known to those skilled in the art including doped silicon dioxide or glass. A first intermetal dielectric layer 18 is provided over the first interlayer dielectric 16. A second intermetal dielectric layer 20 is provided over the first intermetal dielectric layer 18. The first and second intermetal dielectric layers 18, 20 may be any dielectric material, for example, such as silicon dioxide. A plurality of air gaps 54 are formed through the first and second intermetal dielectric layers 18 and 20 and stop on the interlayer dielectric layer 16. A metallization layer 22 is provided over the second intermetal dielectric layer 20. A first passivation layer 24 covers the second intermetal dielectric layer 20 and the metallization layer 22. The first passivation layer 24 includes an upper surface 26 that is non-planar. The first passivation layer 24 may be silicon dioxide. A second passivation layer 28, such as silicon nitride, covers the first passivation layer 24. The second passivation layer 28 includes an upper surface 30 that is non-planar. A planarization layer 32 such as spin-on glass is formed over the second passivation layer 28 and has an upper surface 34 that is planar. The plurality of color filters such as a first color filter 36 which may be for example a red color filter, a second color filter 38 which may be for example a green color filter, and a third color filter 40 which may be for example a blue color filter overlie the planarization layer 32. A spacer layer 44 overlies the color filters 36, 38, 40. A plurality of microlenses 46 are formed over the spacer layer 44 with one microlens 46 being aligned with one of the color filters 36, 38, or 40. As will be appreciated from the light rays 48, 50 and 52, the color image sensor device operates such that a first light ray 48 may enter through one of the microlenses 46 overlying the second color filter 38, travel through the second color filter 38 and may be reflected by one of the first or second intermetal dielectric layers 18 or 20 at the interface with the air gap 54 so that the light ray 48 eventually strikes sensor element 6 which is aligned with the color filter 38. However, as shown by light rays 50 and 52, light may enter through the microlens 46 vertically aligned with the second color filter 38 but travel through the various layers of the device and not strike the second sensing element 6. The light rays 50 and 52 may strike another sensing element, such as sensor 8. This type of light scattering produces cross talk that is unwarranted.

In prior color image sensor devices, the color filters 36, 38, and 40 are arranged to have an overlap region 42 wherein an adjacent color filter, for example 38, overlaps a portion of an adjacent color filter, for example 40. FIG. 2 is a plan view of a portion of a prior art semiconductor device including an image sensor element illustrating the overlap region 42 of adjacent color filters.

The present invention provides alternatives to the prior art.

SUMMARY OF THE INVENTION

One embodiment of the invention includes a semiconductor device comprising a substrate having a plurality of image sensing elements formed therein, a plurality of spaced apart color filters overlying the substrate, and the light blocking material interposed between adjacent spaced apart color filters.

Another embodiment of the invention includes a method of making a semiconductor device comprising providing a semiconductor substrate with a plurality of light sensors formed therein, forming a first passivation layer over the substrate, the first passivation layer having a non-planar upper surface, planarizing the upper surface of the first passivation layer, forming a plurality of air gaps through the first passivation layer, forming a plurality of spaced apart color filters over the first passivation layer, forming a light blocking material between adjacent spaced apart color filters and so that a portion of the light blocking material is interposed between two adjacent color filters and the portion of the light blocking material being vertically aligned with one of the air gaps.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BREIF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 3A:
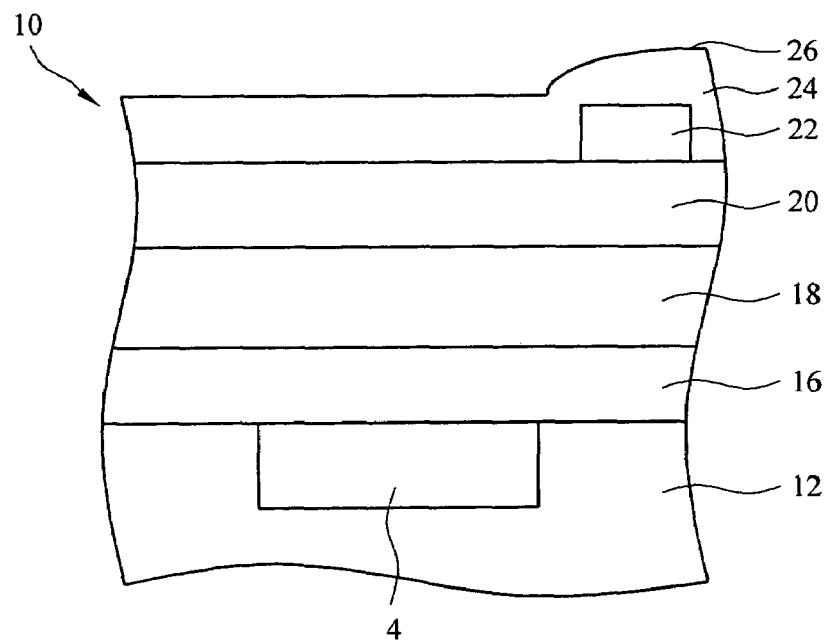
FIG. 3A illustrates one embodiment of a method according to the present invention including forming a first passivation layer over an intermetal dielectric layer.

Referring now to FIG. 3A, one embodiment of the method of making a semiconductor device 10 according to the present invention includes providing a semiconductor substrate 12 such as silicon which may be doped and treated with a variety of elements and materials to provide discrete devices including a plurality of color image sensing elements or sensors 4, 6, 8. An interlayer dielectric 16 may be formed over the substrate 12. The interlayer dielectric 16 may, for example, be silicon dioxide which may be doped and may be deposited by any method known to those skilled in the art including chemical vapor deposition. A first intermetal dielectric 18 is formed over the interlayer dielectric 16, and may include silicon dioxide that may be deposited by a chemical vapor deposition or if desired plasma enhanced chemical vapor deposition. A second intermetal dielectric layer 20, such as silicon dioxide which may be deposited by chemical vapor deposition or plasma enhanced chemical vapor deposition, is deposited over the first intermetal dielectric layer 18. A metallization layer 22, such as AlCu may be deposited over the second intermetal dielectric layer 20 using physical vapor deposition followed by metal etching as desired. A first passivation layer 24 such as silicon dioxide may be deposited over the second intermetal dielectric layer 20 and the metallization layer 22. The first passivation layer 24 has an upper surface 26 that is non-planar. The first passivation layer 24 may be deposited by any method known to those skilled in the art including chemical vapor deposition.

Figure 3B:
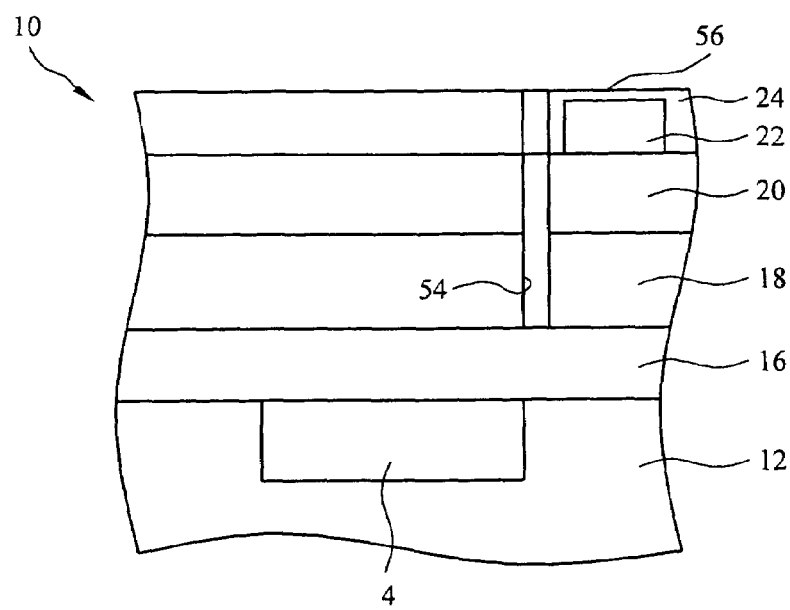
FIG. 3B illustrates one embodiment of a method according to the present invention including planarizing the passivation layer of FIG. 3A.

Referring now to FIG. 3B, according to the present invention the first passivation layer 24 is planarized, for example, by chemical mechanical planarization to provide an upper surface 56 that is substantially planar. The first passivation layer 24 may still covers the portion of the metallization layer 22 after chemical mechanical planarization. Thereafter, a plurality of air gaps 54 or voids are formed through the first passivation layer 24, second intermetal dielectric layer 20, first intermetal dielectric layer 18 and stop on the interlayer dielectric layer 16. The air gaps 54 or voids, for example having a width ranging from 0.1–0.5 μm and length to width ratio of less than 1 to 10, may be formed by plasma dry etching.

Figure 3C:
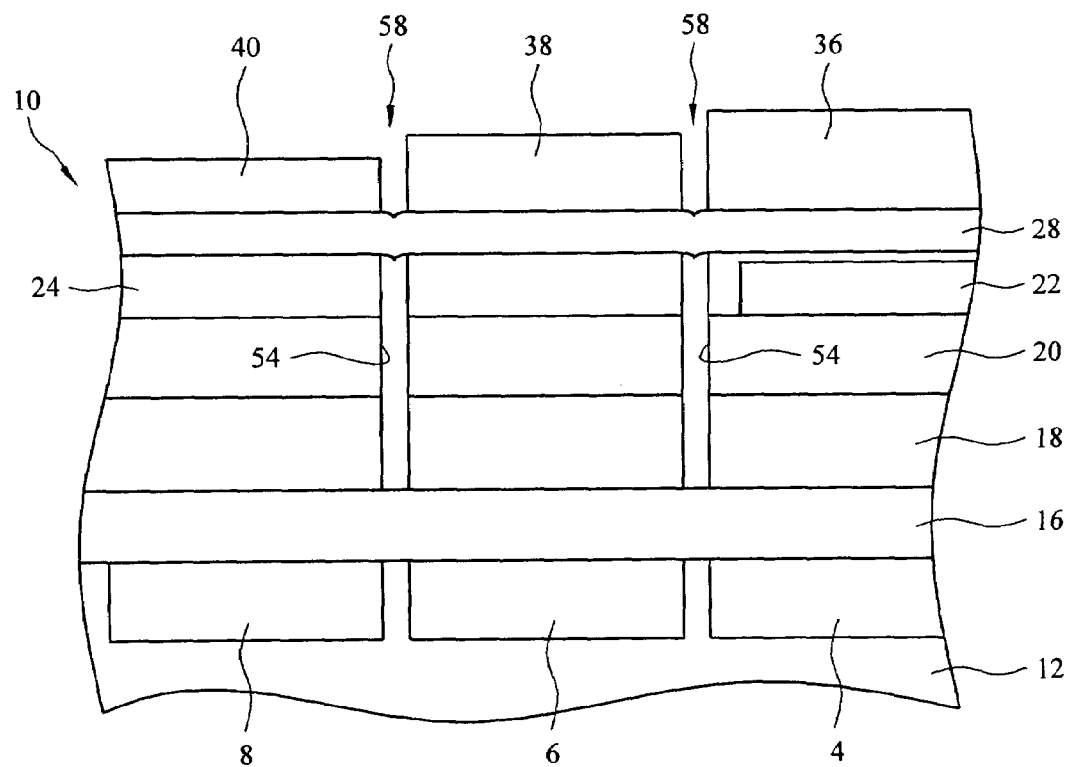
FIG. 3C illustrates one embodiment of the present invention including forming a second passivation layer over the first passivation layer and forming a plurality of color filters over the second passivation layer.

Referring now to FIG. 3C, thereafter a second passivation layer 28, such as silicon nitride may be deposited over the first passivation layer 24. A portion of the second passivation layer 28 may extend slightly into the air gap 54. A plurality of color filters such as a first color filter 36, second color filter 38, and third color filter 40 are formed over the second passivation layer 28. The color filters 36, 38, 40 may be made from any material known to those skilled in the art, such as a photoresist material including selective pigment(s). The color filters 36, 38 and 40 are arranged to be spaced apart from each other providing a void 58 between adjacent color filters.

Figure 3D:
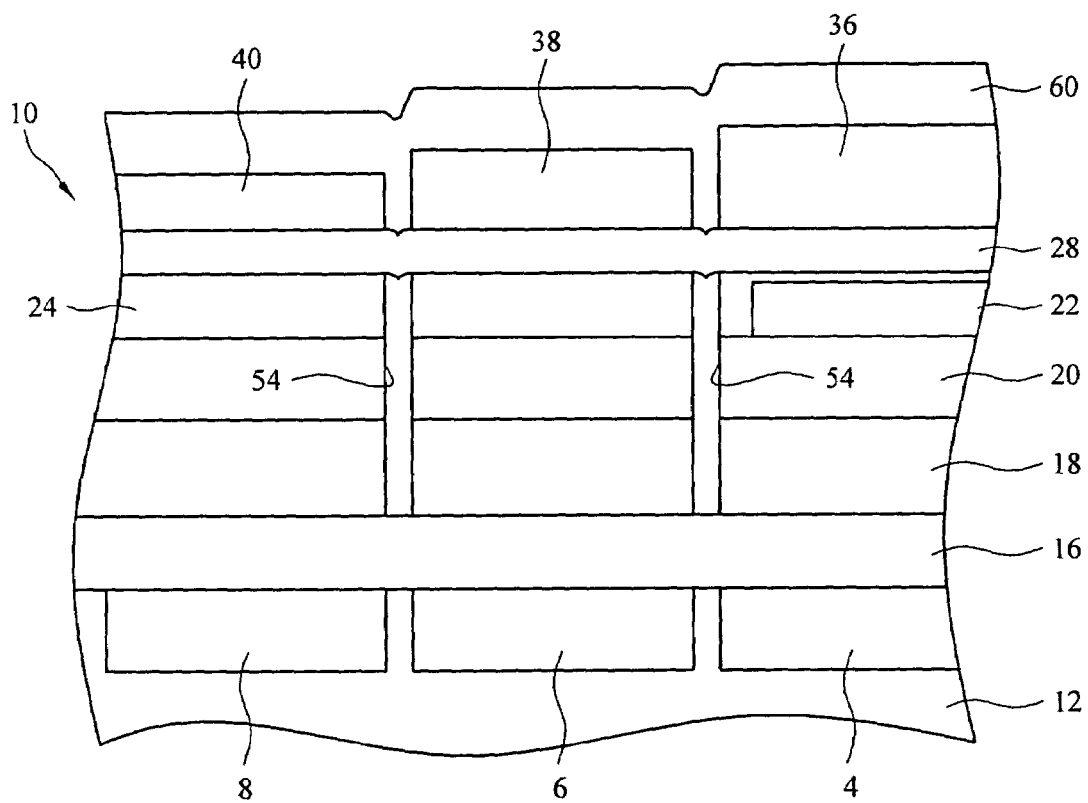
FIG. 3D illustrates another embodiment of a method according to the present invention including forming a light blocking material over the color filters of FIG. 3C.

Referring now to FIG. 3D, a light blocking material 60 is deposited in the void 58 between adjacent color filters 36, 38, 40. The light blocking material 60 may be a photoresist material or any other dielectric or suitable material capable of blocking light or reflecting light. For example, the light blocking material 60 may be a photoresist material including a black pigment. The light blocking material 60 may be formed over the color filters 36, 38 and 40 and into the void 58, for example, by spinning on a photoresist material. In one embodiment the width of the light blocking material between adjacent color filters ranges from 0.1–0.5 μm.

Figure 3E:
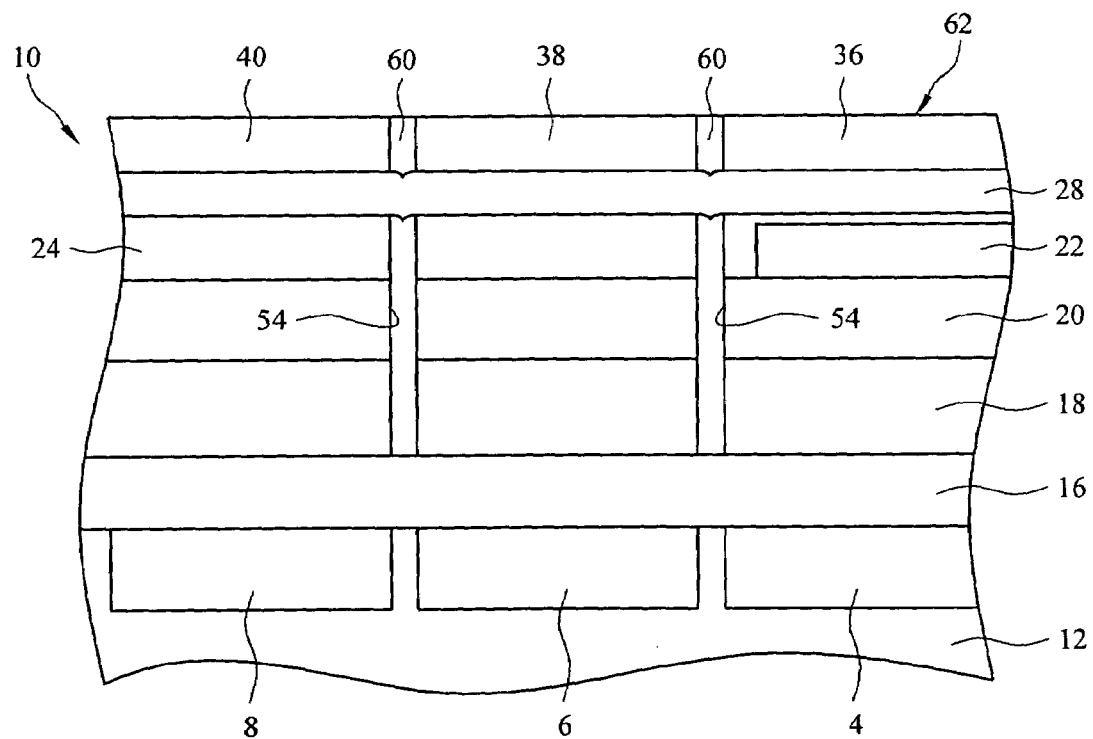
FIG. 3E illustrates another embodiment of a method according to the present invention including etching back the light blocking material and the color filters.

Referring now to FIG. 3E, thereafter, the light blocking material 60 and the color filters 36, 38 and 40 are etched back, preferably so that the thickness of the color filters 36, 38 and 40 is reduced. No light blocking material remains over any of the color filters and the color filters 36, 38 and 40 and the light blocking material 60 provide a surface 62 that is substantially planar.

Figure 3F:
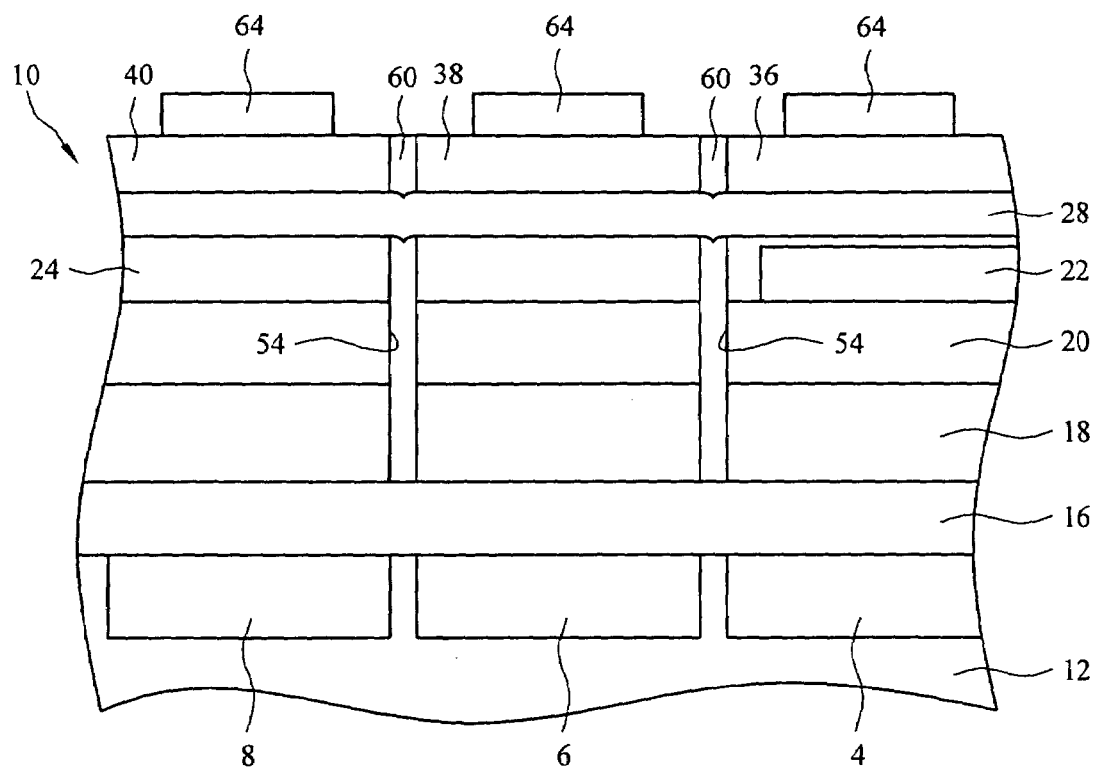
FIG. 3F illustrates another embodiment of a method according to the present invention including depositing a lens material over each one of the color filters of FIG. 3E.

Referring now to FIG. 3F, a lens material 64 may be formed over each one of the color filters 36, 38 and 40. The lens material 64 may be of any material known to those skilled in the art for making lenses, including a photoresist material.

Figure 3G:
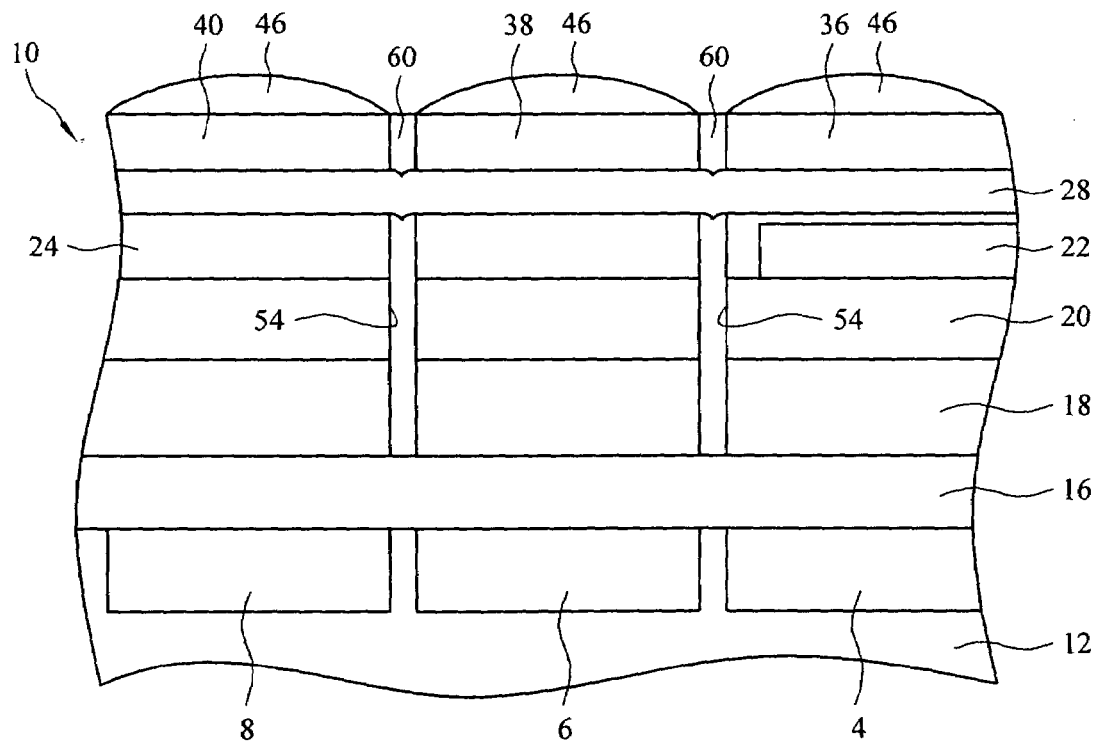
FIG. 3G illustrates one embodiment of a method according to the present invention including forming microlenses out of the lens material of FIG. 3F.

Referring now to FIG. 3G, the lens material 64 is formed into a microlens 46 so that a microlens 46 is positioned over each of the color filters 46, 38 and 40. This can be accomplished by selectively and controllably heating the photoresist material that is used as the lens material 64 or by controlled etching.

Figure 1:
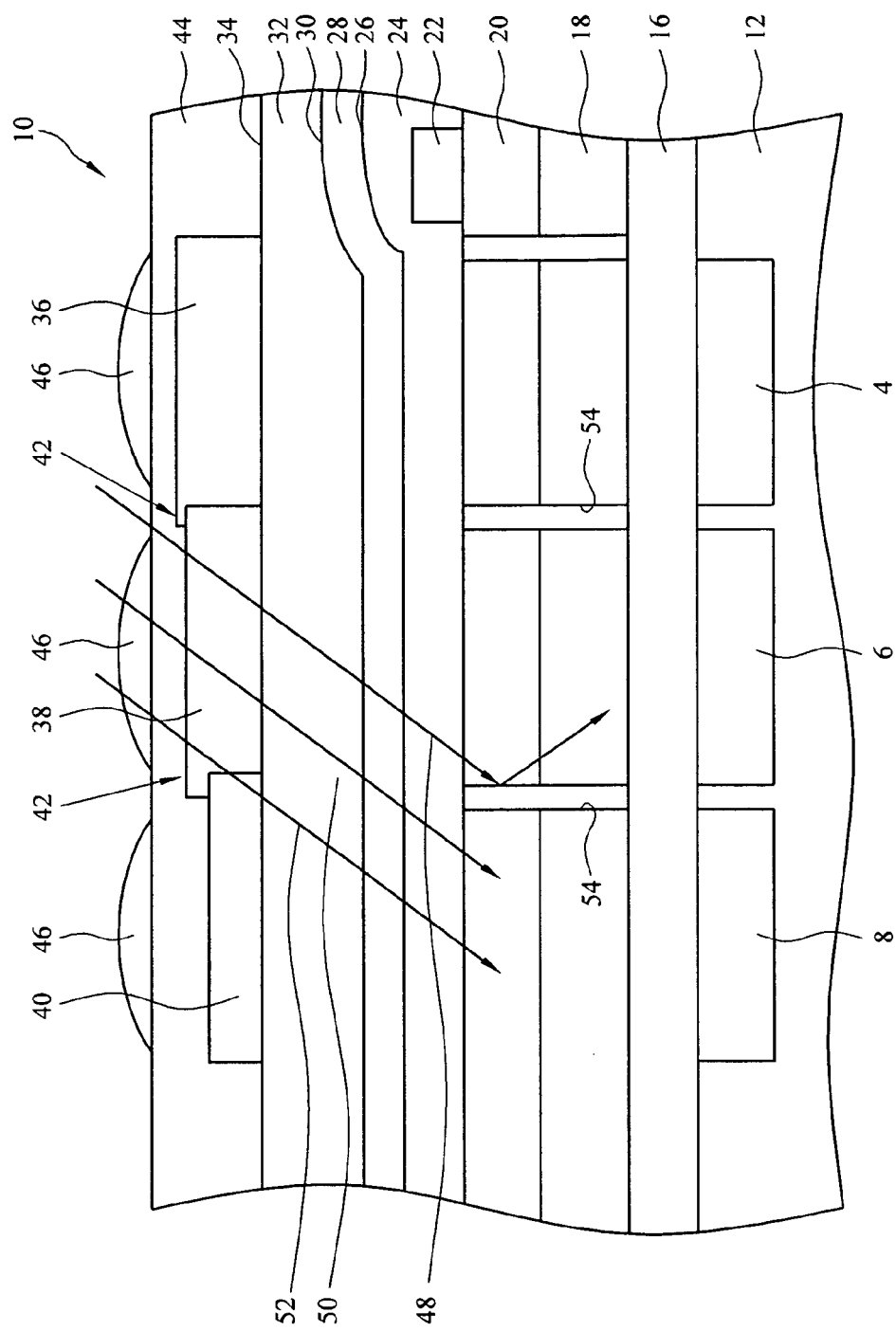
FIG. 1 illustrates a prior art semiconductor device including a color image sensor.
Figure 2:
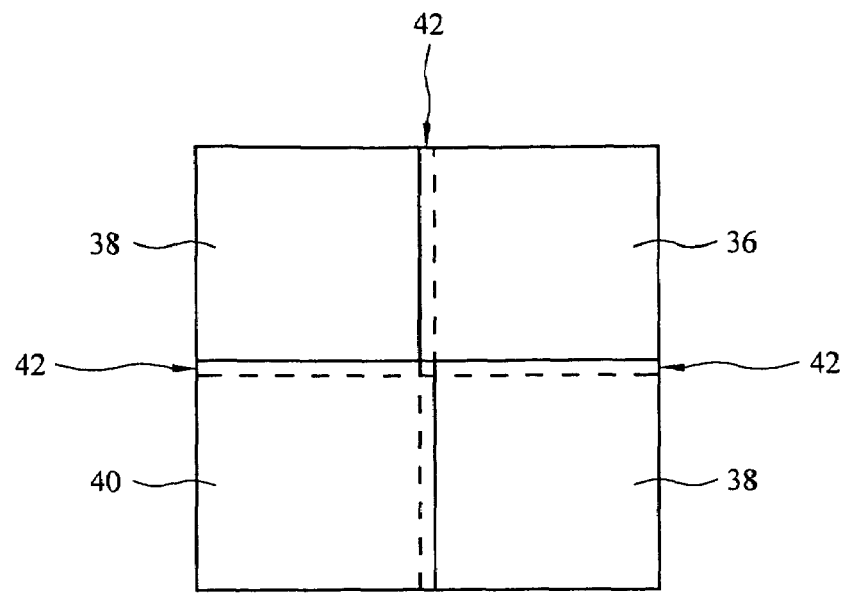
FIG. 2 is a plan view of a portion of the prior art semiconductor device of FIG. 1.
Figure 4:
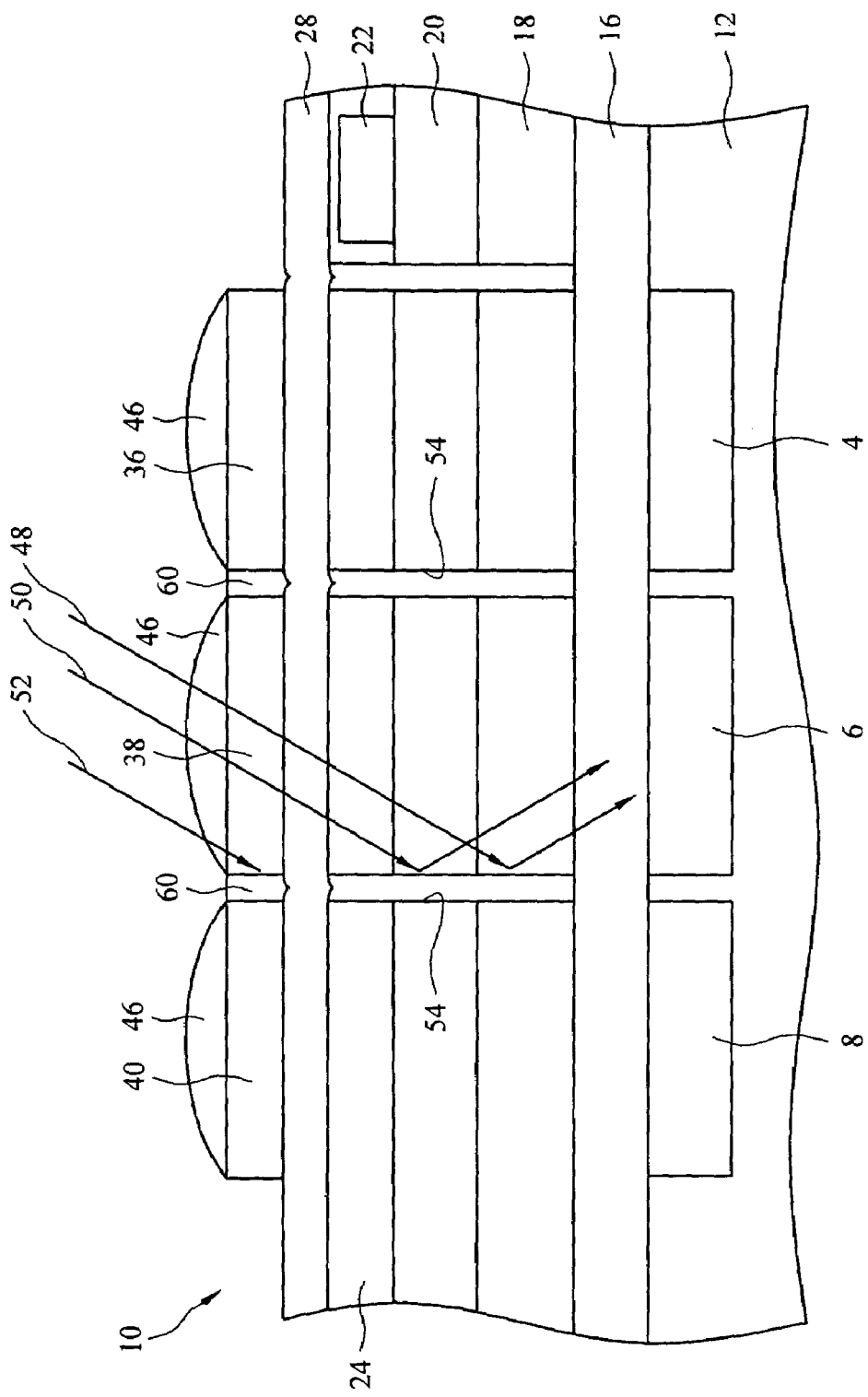
FIG. 4 illustrates a semiconductor device including a color image sensor according to one embodiment of the present invention.

Referring now to FIG. 4, as will be appreciated the microlens 46 and each one of the color filters 36, 38 and 40 is positioned at a distance much closer to the intermetal dielectric layers 18, 20 and the sensors 4, 6 and 8, in comparison to the prior art device shown in FIG. 1. As will be appreciated by the light rays 48, 50, light may enter through one of the microlenses 46 and be reflected in one of the intermetal dielectric layers 18 or 20 near the edge where the air gap 54 is formed and ultimately strike the sensor 6. As will be appreciated by light ray 52, light may travel through the microlens 40 and is blocked by the light blocking material 60 from passing through the device that would allow it to strike an adjacent sensor 8.

Figure 5:
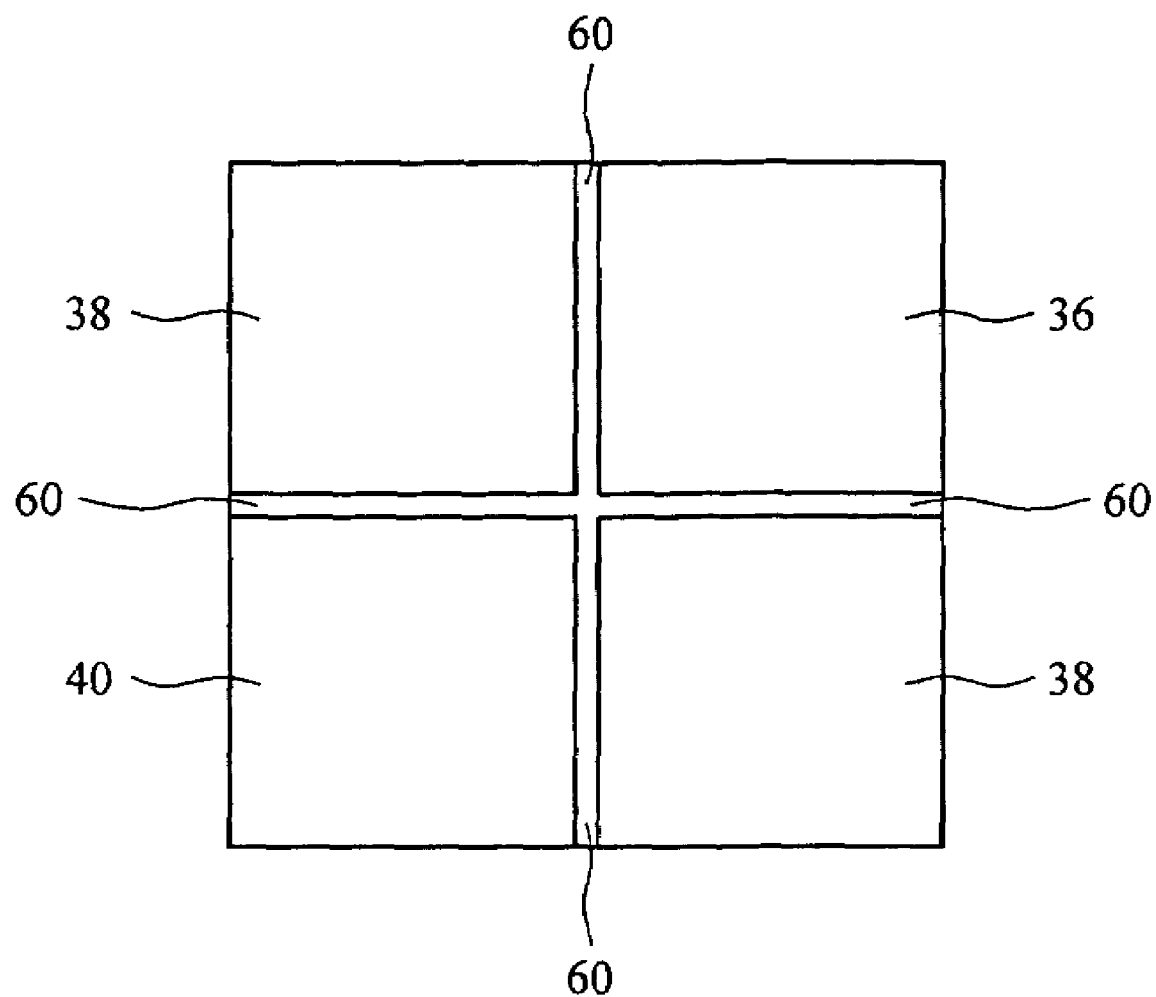
FIG. 5 is a plan view of one embodiment showing a portion of a semiconductor device including color sensing elements according to the present invention.

Referring now to FIG. 5, which is a plan view showing a portion of a semiconductor device 10 according to the present invention, each of the color filters 36, 38 and 40 are separated from each other with the light blocking material 60 interposed between adjacent color filters.

When the terms "over", "overlying", "overlies" is used herein with respect to the relative position of a first component with respect to a second component of the invention, the same shall mean that the first component may be in direct contact with the second component or one or more layers of materials or components may be interposed between the first component and the second component. Similarly, where the terms "under", "underlying", "underlies" are used herein with respect to relative position of a first component to a second component of the invention, the same shall mean that the first component may be in direct contact with the second component, or that one or more layers or components may be interposed between the first component and the second component.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor device comprising:
   a substrate having plurality of image sensing elements formed therein;
   a plurality of spaced apart color filters overlying the substrate;
   a microlens over at least one of the color filters wherein the microlens comprises a photoresist material; and
   a light blocking material interposed between adjacent spaced apart color filters, wherein each color filter and light blocking material comprises an upper surface that is substantially planar.

2. A semiconductor device as set forth in claim 1 wherein the light blocking material comprises a black pigment.

3. A semiconductor device as set forth in claim 1 further comprising a first passivation layer underlying each color filter.

4. A semiconductor device as set forth in claim 3 further comprising a second passivation layer interposed between the color filters and the first passivation layer.

5. A semiconductor device as set forth in claim 3 wherein the first passivation layer includes an upper surface that is substantially planar.

6. A semiconductor device as set forth in claim 3 further comprising a first intermetal dielectric layer underlying the first passivation layer.

7. A semiconductor device as set forth in claim 6 including a plurality of air gaps formed through the thickness of the first intermetal dielectric layer and aligned with the light blocking material interposed between adjacent spaced apart colored filters.

8. A semiconductor device as set forth in claim 6 further comprising a second intermetal dielectric layer interposed between the first passivation layer and the first intermetal dielectric layer.

9. A semiconductor device as set forth in claim 8 further including a plurality of air gaps formed through the thickness of the first intermetal dielectric layer, the second intermetal dielectric layer and aligned with the light blocking materials interposed between adjacent spaced apart color filters.

10. A semiconductor device as set forth in claim 9 further comprising an interlayer dielectric layer underlying the first intermetal dielectric layer.

11. A semiconductor device as set forth in claim 10 further comprising a substrate underlying the interlayer dielectric layer and having a plurality of color image sensors formed therein each vertically aligned with one of the color filters.

12. A semiconductor device as set forth in claim 11 wherein the substrate comprises silicon.

13. A semiconductor device as set forth in claim 1 wherein a first intermetal dielectric layer comprises silicon dioxide.

14. A semiconductor device as set forth in claim 1 wherein each of the colored filters comprises a photoresist material.

15. A semiconductor device as set forth in claim 1 wherein one of the color filters allows green light to pass, one of the color filters allows red light to pass, and one of the color filters allows blue light to pass therethrough.

16. A semiconductor device as set forth in claim 1 wherein the light blocking material interposed between adjacent spaced apart color filters has a width ranging from 0.1–0.5 µm.

17. A semiconductor device as set forth in claim 7 wherein each of the air gaps has a width ranging from 0.1–0.5 µm.

18. A semiconductor device as set forth in claim 9 wherein each of the air gaps has a length to width ratio equal to or less than 1–10.

19. A semiconductor device comprising:
    substrate having plurality of image sensing elements formed therein;
    a plurality of spaced apart color filters overlying the substrate;
    a first intermetal dielectric layer and a metallization layer including at least a portion in the first intermetal dielectric layer; and
    an air gap formed through the first intermetal dielectric layer.

20. A semiconductor device as set forth in claim 19 further comprising a light blocking material interposed between adjacent spaced apart color filters.

21. A semiconductor device as set forth in claim 20 wherein the light blocking material comprises a black pigment.

22. A semiconductor device as set forth in claim 20 wherein each color filter and light blocking material comprises an upper surface that is substantially planar.

23. A semiconductor device as set forth in claim 20 further comprising a microlens over at least one of the color filters.

24. A semiconductor device as set forth in claim 20 further comprising a first passivation layer underlying each color filter.

25. A semiconductor device as set forth in claim 24 wherein the second passivation layer interposed between the color filters and the first passivation layer.

26. A semiconductor device as set forth in claim 24 wherein the first passivation layer includes an upper surface that is substantially planar.

27. A semiconductor device as set forth in claim 24 further comprising a first intermetal dielectric layer underlying the first passivation layer.

28. A semiconductor device as set forth in claim 27 including a plurality of air gaps formed through the thickness of the first intermetal dielectric layer and aligned with the light blocking material interposed between adjacent spaced apart colored filters.

29. A semiconductor device as set forth in claim 27 further comprising a second intermetal dielectric layer interposed between the first passivation layer and the first intermetal dielectric layer.

30. A semiconductor device as set forth in claim 29 further including a plurality of air gaps formed through the thickness of the first intermetal dielectric layer, the second intermetal dielectric layer and aligned with the light blocking materials interposed between adjacent spaced apart color filters.

31. A semiconductor device as set forth in claim 30 further comprising an interlayer dielectric layer underlying the first intermetal dielectric layer.

32. A semiconductor device as set forth in claim 31 wherein the plurality of color image sensors in the substrate are each vertically aligned with one of the color filters.

33. A semiconductor device as set forth in claim 32 wherein the substrate comprises silicon.

34. A semiconductor device as set forth in claim 23 wherein the microlens comprises a photoresist material.

35. A semiconductor device as set forth in claim 19 wherein each of the colored filters comprises a photoresist material.

36. A semiconductor device as set forth in claim 19 wherein one of the color filters allows green light to pass, one of the color filters allows red light to pass, and one of the color filters allows blue light to pass therethrough.

37. A semiconductor device as set forth in claim 19 wherein the light blocking material interposed between adjacent spaced apart color filters has a width ranging from 2–3 µm.

38. A semiconductor device as set forth in claim 28 wherein each of the air gaps has a width ranging from 2–3 µm.

39. A semiconductor device as set forth in claim 30 wherein each of the air gaps has a length to width ratio equal to or less than 1–10.

40. A semiconductor device comprising:
  substrate having plurality of image sensing elements formed therein;
  a plurality of spaced apart color filters overlying the substrate;
  a first intermetal dielectric layer and a metallization layer including at least a portion in the first intermetal dielectric layer;
  a second intermetal dielectric layer underlying the first intermetal dielectric layer and a first interlayer dielectric underlying the second intermetal dielectric layer; and
  an air gap formed through the first intermetal dielectric layer, the second intermetal dielectric layer and the first interlayer dielectric.

41. A semiconductor device comprising:
  a substrate having plurality of image sensing elements formed therein;
  a plurality of spaced apart color filters overlying the substrate;
  a first passivation layer underlying each color filter;
  a second passivation layer interposed between the color filters and the first passivation layer;
  a microlens over at least one of the color filters wherein the microlens comprises a photoresist material; and
  a light blocking material interposed between adjacent spaced apart color filters, wherein each color filter and light blocking material comprises an upper surface that is substantially planar.

42. A semiconductor device as set forth in claim 41 further comprising a first intermetal dielectric layer underlying the first passivation layer.

43. A semiconductor device as set forth in claim 42 including a plurality of air gaps formed through the thickness of the first intermetal dielectric layer and aligned with the light blocking material interposed between adjacent spaced apart colored filters.

44. A semiconductor device as set forth in claim 42 further comprising a second intermetal dielectric layer interposed between the first passivation layer and the first intermetal dielectric layer.

45. A semiconductor device as set forth in claim 44 wherein said plurality of air gaps are formed through the thickness of the first intermetal dielectric layer, the second intermetal dielectric layer and aligned with the light blocking material interposed between adjacent spaced apart color filters.

46. A semiconductor device as set forth in claim 41 wherein the plurality of image sensing elements in the substrate are color image sensors each vertically aligned with one of the color filters.

47. A semiconductor device as set forth in claim 41 wherein each of the colored filters comprises a photoresist material.

48. A semiconductor device as set forth in claim 41 wherein one of the color filters allows green light to pass, one of the color filters allows red light to pass, and one of the color filters allows blue light to pass therethrough.

49. A semiconductor device comprising:
  a substrate having plurality of image sensing elements formed therein;
  a plurality of spaced apart color filters overlying the substrate;
  a first passivation layer underlying each color filter;
  a first intermetal dielectric layer underlying the first passivation layer;
  a plurality of air gaps formed through the thickness of the first intermetal dielectric layer;
  a microlens over at least one of the color filters wherein the microlens comprises a photoresist material; and
  a light blocking material interposed between adjacent spaced apart color filters, wherein each color filter and light blocking material comprises an upper surface that is substantially planar, said plurality of air gaps in said first intermetal dielectric layer aligned with said light blocking material.

50. A semiconductor device as set forth in claim 49 further comprising a second intermetal dielectric layer interposed between the first passivation layer and the first intermetal dielectric layer.

51. A semiconductor device as set forth in claim 50 wherein said plurality of air gaps are formed through the thickness of the first intermetal dielectric layer, the second intermetal dielectric layer and aligned with said light blocking material.

52. A semiconductor device as set forth in claim 49 wherein the plurality of image sensing elements in the substrate are color image sensors each vertically aligned with one of the color filters.

53. A semiconductor device as set forth in claim 49 wherein each of the colored filters comprises a photoresist material.

54. A semiconductor device as set forth in claim 49 wherein one of the color filters allows green light to pass, one of the color filters allows red light to pass, and one of the color filters allows blue light to pass therethrough.

* * * * *